US011269018B2

(12) United States Patent
Choi

(10) Patent No.: US 11,269,018 B2
(45) Date of Patent: Mar. 8, 2022

(54) APPARATUS AND METHOD FOR PREVENTING SHORT CIRCUIT

(71) Applicant: LG CHEM, LTD., Seoul (KR)

(72) Inventor: Jin-Hwee Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 298 days.

(21) Appl. No.: 16/615,577

(22) PCT Filed: Dec. 7, 2018

(86) PCT No.: PCT/KR2018/015567
§ 371 (c)(1),
(2) Date: Nov. 21, 2019

(87) PCT Pub. No.: WO2019/117555
PCT Pub. Date: Jun. 20, 2019

(65) Prior Publication Data
US 2020/0081052 A1    Mar. 12, 2020

(30) Foreign Application Priority Data

Dec. 11, 2017 (KR) .......................... 10-2017-0169306

(51) Int. Cl.
*G01R 31/52* (2020.01)
*E05B 81/64* (2014.01)
(Continued)

(52) U.S. Cl.
CPC .............. *G01R 31/52* (2020.01); *E05B 81/64* (2013.01); *G01R 19/165* (2013.01); *H02H 9/025* (2013.01)

(58) Field of Classification Search
CPC ...... G01R 19/165; G01R 31/50; G01R 31/52; E05B 81/64; H02H 9/025
See application file for complete search history.

(56) References Cited

U.S. PATENT DOCUMENTS 3,916,309 A * 10/1975 Foulkes ................ G01R 19/04
324/103 P
5,689,395 A    11/1997 Duffy et al.
(Continued)

FOREIGN PATENT DOCUMENTS

CN    1216827 A      5/1999
CN    101059552 A  * 10/2007   ........... G01R 31/343
(Continued)

OTHER PUBLICATIONS

Extended European Search Report dated Oct. 29, 2020 for corresponding EP Patent Application No. 18889917.3.
(Continued)

*Primary Examiner* — Patrick Assouad
*Assistant Examiner* — Demetrius R Pretlow
(74) *Attorney, Agent, or Firm* — Birch, Stewart, Kolasch & Birch, LLP

(57) ABSTRACT

An apparatus for preventing short circuit including an input/output terminal electrically connected, via a second external power line, to an external apparatus that is electrically connected to one of a driving voltage supply or a ground via a first external power line; an internal power line electrically connecting one of the driving voltage supply or the ground to the input/output terminal; a switch mounted on the internal power line to energize or block the internal power line; a variable resistor mounted on the internal power line; and a controller determining whether the input/output terminal is shorted based on a measurement current value of a current flowing through the internal power line and controlling a set resistance value of the variable resistor based on whether the input/output terminal is shorted.

9 Claims, 5 Drawing Sheets

(51) Int. Cl.
*G01R 19/165* (2006.01)
*H02H 9/02* (2006.01)

(56) References Cited

U.S. PATENT DOCUMENTS

| | | | |
|---|---|---|---|
| 5,926,354 A | 7/1999 | King | |
| 6,140,928 A | 10/2000 | Shibuya et al. | |
| 6,285,191 B1* | 9/2001 | Gollomp | G01R 31/006 324/427 |
| 6,349,022 B1 | 2/2002 | Myong et al. | |
| 6,421,216 B1* | 7/2002 | Myong | H02H 3/025 361/103 |
| 7,031,132 B1* | 4/2006 | Mitchell | H02H 9/026 361/103 |
| 10,538,165 B2* | 1/2020 | Dadras | B60L 53/38 |
| 2005/0270034 A1* | 12/2005 | Tsuchiya | G01R 31/52 324/509 |
| 2007/0090802 A1 | 4/2007 | Seo | |
| 2010/0264881 A1 | 10/2010 | Yin et al. | |
| 2011/0308162 A1 | 12/2011 | Kamiya | |
| 2012/0065845 A1* | 3/2012 | Satake | B60N 2/002 701/47 |
| 2012/0161781 A1* | 6/2012 | Luo | G01R 31/50 324/548 |
| 2013/0038343 A1* | 2/2013 | Tu | G01R 31/64 324/754.03 |
| 2013/0193939 A1* | 8/2013 | Sakaguchi | G05F 1/5735 323/277 |
| 2014/0368111 A1* | 12/2014 | Hebborn | H05B 45/58 315/76 |
| 2015/0219691 A1* | 8/2015 | Cook | G01R 15/183 324/127 |
| 2016/0125811 A1* | 5/2016 | Park | G09G 3/3258 345/694 |
| 2016/0202305 A1* | 7/2016 | Umeno | G01R 31/52 324/509 |
| 2016/0212820 A1* | 7/2016 | Kalkschmidt | H05B 45/50 |
| 2016/0231382 A1* | 8/2016 | Hirose | H02J 7/0068 |
| 2016/0331211 A1 | 11/2016 | Fujisawa | |
| 2016/0372910 A1 | 12/2016 | Hansen | |
| 2017/0222550 A1* | 8/2017 | Chan | H02M 3/156 |
| 2017/0337963 A1* | 11/2017 | Takagimoto | H04B 10/502 |
| 2018/0205372 A1* | 7/2018 | Sasaki | H03K 17/0828 |
| 2019/0049534 A1* | 2/2019 | Guan | G01R 31/2822 |
| 2019/0067931 A1* | 2/2019 | Li | H02H 3/16 |
| 2019/0170802 A1* | 6/2019 | Ling | G01R 31/389 |
| 2020/0300922 A1* | 9/2020 | Ito | B60R 16/03 |
| 2021/0164810 A1* | 6/2021 | Bruckhaus | G01D 5/18 |

FOREIGN PATENT DOCUMENTS

| | | | | |
|---|---|---|---|---|
| CN | 101527448 A | | 9/2009 | |
| CN | 106526404 A | * | 3/2017 | |
| CN | 106659896 A | * | 5/2017 | ........... A61N 1/3706 |
| CN | 112186721 A | * | 1/2021 | |
| JP | 2000-514996 A | | 11/2000 | |
| JP | 2000-516798 A | | 12/2000 | |
| JP | 2012-1960 A | | 1/2012 | |
| JP | 2012-13044 A | | 1/2012 | |
| JP | 2012-157191 A | | 8/2012 | |
| JP | 2016-115283 A | | 6/2016 | |
| KR | 10-1999-0044602 A | | 6/1999 | |
| KR | 20040068714 A | * | 8/2004 | |
| KR | 10-0709258 B1 | | 4/2007 | |
| KR | 10-2013-0088800 A | | 8/2013 | |
| KR | 10-2013-0089077 A | | 8/2013 | |
| KR | 20130104594 A | * | 9/2013 | |
| KR | 101373165 B1 | * | 3/2014 | |
| KR | 20140060180 A | * | 5/2014 | .............. H02J 50/12 |
| KR | 101646070 B1 | * | 8/2016 | |
| KR | 10-2017-0005910 A | | 1/2017 | |
| RU | 2602994 C1 | * | 11/2016 | |
| WO | WO 98/02947 A1 | | 1/1998 | |
| WO | WO 2015/194223 A1 | | 12/2015 | |

OTHER PUBLICATIONS

International Search Report (PCT/ISA/210) issued in PCT/KR2018/015567, dated Mar. 25, 2019.

* cited by examiner

APPARATUS AND METHOD FOR PREVENTING SHORT CIRCUIT

TECHNICAL FIELD

The present application claims priority to Korean Patent Application No. 10-2017-0169306 filed on Dec. 11, 2017 in the Republic of Korea, the disclosures of which are incorporated herein by reference.

The present disclosure relates to an apparatus and method for preventing short circuit, and more particularly, to an apparatus and method for preventing short circuit, whereby a short circuit between an external apparatus and a driving voltage supply is prevented.

BACKGROUND ART

The paradigm for automobile technology has recently been shifting from individual functions to an integrated system. For example, safety and convenience are improved through convergence of heterogeneous technologies including IT, electrics/electronics, environment, material science, etc. In particular, growth in techniques related to electrics/electronics is prominent; electronics parts include electric and electronic components that operate by receiving power of a vehicle battery, small-sized substrates including resistors or capacitors, and also direct current relays for vehicles.

A direct current relay for vehicles, from among electronics parts, is an apparatus that opens or closes another circuit by operating when an input reaches a certain value, and its importance is gradually increasing in respect of driver's safety and maintenance of the vehicle. In particular, in case an over-current occurs, it may lead to an explosion of the direct current relay for vehicles, and thus, it is essential to test reaction of a vehicle relay to an over-current.

FIGS. 1 and 2 are configuration diagrams of a relay testing apparatus according to the related art, respectively before and after a short circuit.

A relay testing apparatus 10 according to the related art will be described with reference to FIGS. 1 and 2. A power supply 11 and an external apparatus 15 are connected via a power line, and a relay 14 is mounted on the power line. Also, a voltage sensor 12 measuring a voltage difference between both ends of the relay 14 is mounted at both ends of the relay 14.

Next, an operating state of the relay 14 is controlled via a control unit 13, and the relay 14 is diagnosed based on a voltage difference at both ends measured using the voltage sensor 12 based on the operating state of the relay 14.

Here, as illustrated in FIG. 2, when a short circuit occurs in a section between the relay 14 and the external apparatus 15 from a ground due to a vehicle accident or incorrect connection of circuits, an internal circuit of the relay testing apparatus 10 is changed to a nonleaded state and a high current flows accordingly. Thus, the power supply 11 of the relay testing apparatus 10 is discharged, thus preventing diagnosing the relay 14.

DISCLOSURE

Technical Problem

The present disclosure is designed to solve the problems of the related art, and therefore the present disclosure is directed to providing an apparatus and method for preventing short circuit, whereby a short circuit occurring in an input/output terminal connected to an external apparatus may be prevented by changing a set resistance value of a variable resistance unit on an internal power line electrically connected to the input/output terminal.

The present disclosure is directed to an apparatus and method for estimating a remaining battery capacity, in which a remaining capacity of a half cell may be accurately estimated without inserting a reference electrode, by correcting a total section of a charging state of the half cell by using a point of inflection detected based on charging state-voltage data of each of a full cell and the half cell and by estimating, as a remaining capacity, a difference in the charging state before and after correcting the total section of the charging state of the half cell.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for preventing short circuit including: an input/output terminal configured to be electrically connected, via a second external power line, to an external apparatus that is electrically connected to one of a driving voltage supply and a first ground via a first external power line; an internal power line electrically configured to connect one of the driving voltage supply or the first ground to the input/output terminal; a switch configured to be mounted on the internal power line, the switch having a first one electrically connected to the input/output terminal and configured to energize or block the internal power line; a variable resistor configured to be mounted on the internal power line and configured to be electrically connected to a second end of the switch; and a controller configured to determine whether the input/output terminal is shorted based on a measurement current value of a current flowing through the internal power line and control a set resistance value of the variable resistor based on whether the input/output terminal is shorted.

Preferably, when the measurement current value exceeds a preset reference current value, the controller may determine that the input/output terminal is shorted.

Preferably, when the first ground and the external apparatus are electrically connected via the first external power line, the driving voltage supply and the input/output terminal are electrically connected via the internal power line, and when the measurement current value exceeds a preset reference current value, the controller may determine that the input/output terminal is shorted from a second different from the first ground connected to the external apparatus.

Preferably, when the controller determines that the input/output terminal is shorted, the controller may control a set resistance value of the variable resistor unit to be a preset reference resistance value.

Preferably, the controller may determine whether an operating state of the switch is any one operating state of a turned-on state or a turned-off state based on a measurement voltage difference between a first measurement voltage value of a first one end voltage applied to the first end of the switch and a second measurement voltage value of a second end voltage applied to the second end of the switch.

Preferably, when the controller determines that the switch is in the turned-on state, the controller may determine whether the input/output terminal is shorted, and control the set resistance value of the variable resistor based on whether the input/output terminal is shorted.

Preferably, when the controller determines that the switch is in the turned-off state, the controller may not determine whether the input/output terminal is shorted.

A battery pack according to the present disclosure may include the apparatus for preventing short circuit.

A vehicle according to the present disclosure may include the apparatus for preventing short circuit.

Advantageous Effects

According to the present disclosure, when a short circuit occurs in an input/output terminal connected to an external apparatus, the short circuit may be blocked by changing a set resistance value of a variable resistor unit on an internal power line electrically connected to the input/output terminal, thereby preventing a high current from flowing through the internal power line and an output of a driving voltage supply from exceeding an output limit.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

MODE FOR DISCLOSURE

Figure 1:
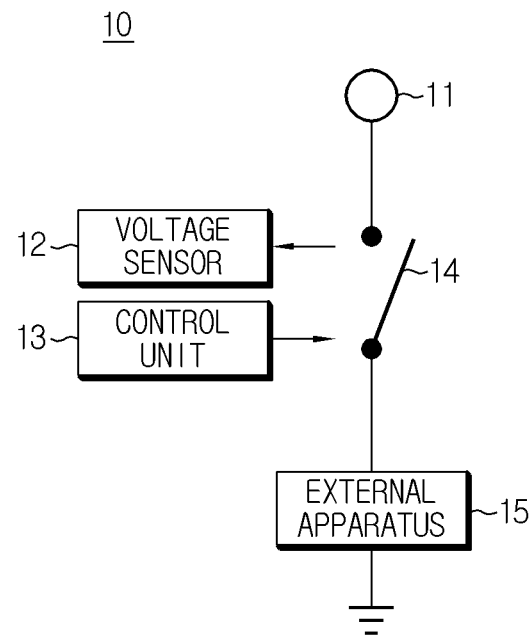
FIGS. 1 and 2 illustrate a configuration of a relay testing apparatus according to the related art, before and after a short circuit.
Figure 2:
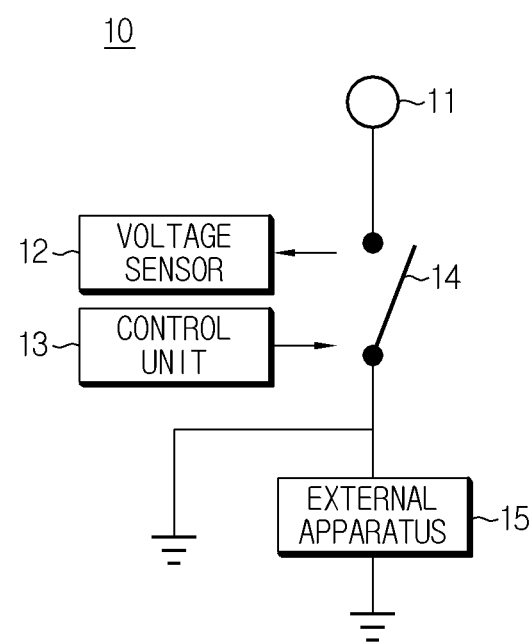

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Also, in the description of the present disclosure, certain detailed explanations of related art or functions are omitted when it is deemed that they may unnecessarily obscure the essence of the disclosure.

Terms including ordinals, such as first, second, etc., are used for the purpose of distinguishing one of the various components from the rest, and are not used to define components by such terms.

Throughout the specification, when a portion "includes" a component, it is intended to indicate that another component may be further included instead of excluding the other component, unless otherwise indicated. Also, the term such as "control unit" herein denotes a unit of processing at least one function or operation, and may be embodied via hardware, software, or a combination of hardware and software.

In addition, throughout the specification, when a portion is "connected" to another portion, they may be not only "directly connected", but may also be "indirectly connected" with another device therebetween.

An apparatus for preventing short circuit according to the present disclosure may be electrically connected, via a second external power line, to an external apparatus that is electrically connected to one of a driving voltage supply and a ground via a first external power line.

Here, the driving voltage supply and the ground may be a driving voltage supply and a ground that are located outside the apparatus for preventing short circuit according to the present disclosure.

The apparatus for preventing short circuit according to the present disclosure may include an input/output terminal unit electrically connected to an external apparatus via a second external power line.

The apparatus for preventing short circuit according to the present disclosure may include an internal power line that electrically connects one of the driving voltage supply and the ground included therein to the input/output terminal unit.

Meanwhile, an apparatus for preventing short circuit 100 according to an embodiment of the present disclosure may be electrically connected, via a second external power line OL2, to an external apparatus 1 that is electrically connected to a ground GND via a first external power line OL1.

The apparatus for preventing short circuit 100 according to an embodiment of the present disclosure may include an internal power line IL connecting a driving voltage supply Vo included therein to the input/output terminal unit 110.

Hereinafter, the apparatus for preventing short circuit 100 according to an embodiment of the present disclosure will be described in detail.

Figure 3:
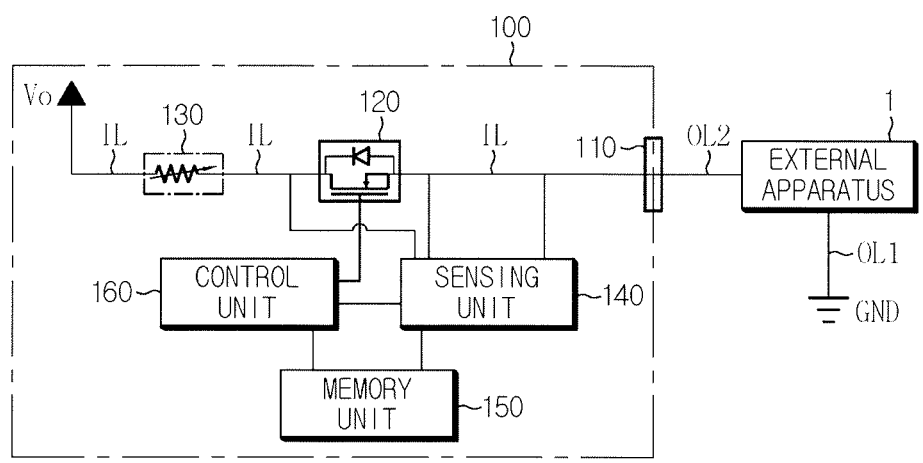
FIG. 3 illustrates a configuration of an apparatus for preventing short circuit according to an embodiment of the present disclosure, before a short circuit.
Figure 4:
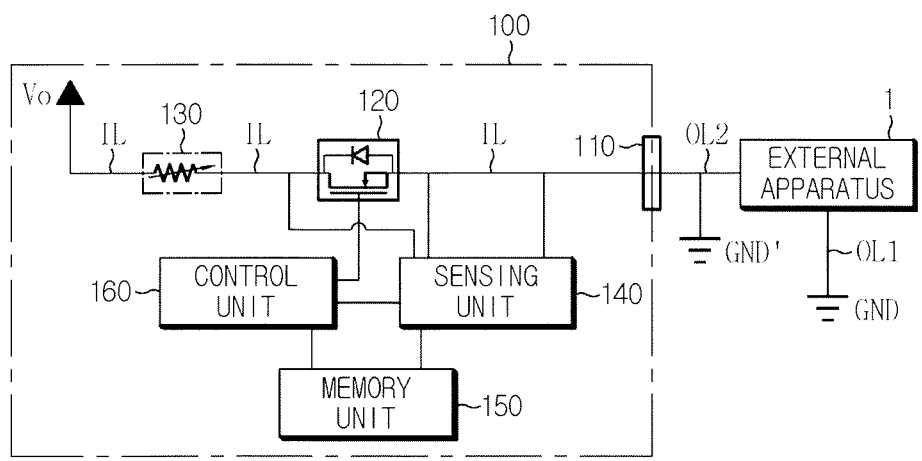
FIG. 4 illustrates a configuration of an apparatus for preventing short circuit according to an embodiment of the present disclosure, after a short circuit.

FIG. 3 illustrates a configuration of the apparatus for preventing short circuit 100 according to an embodiment of the present disclosure, before a short circuit, and FIG. 4 illustrates a configuration of the apparatus for preventing short circuit 100 according to an embodiment of the present disclosure, after a short circuit.

First, referring to FIG. 3, the apparatus for preventing short circuit 100 according to an embodiment of the present disclosure may include an input/output terminal unit 110, an internal power line IL, a switching unit 120, a variable resistor unit 130, a sensing unit 140, a memory unit 150, and a control unit 160. In addition, the apparatus for preventing short circuit 100 according to an embodiment of the present disclosure may further include a driving voltage supply Vo therein.

As described above, the input/output terminal unit 110 may be electrically connected, via a second external power line OL2, to an external apparatus 1 that is electrically connected to the ground GND via a first external power line OL1.

Here, the input/output terminal unit 110 may act as an output terminal outputting a driving voltage of the driving voltage supply Vo to the external apparatus 1.

Meanwhile, the internal power line IL may electrically connect the driving voltage supply Vo provided therein to the input/output terminal unit 110.

Accordingly, a driving voltage of the driving voltage supply Vo may be applied to the input/output terminal unit 110 via the internal power line IL.

The switching unit 120 may be mounted on the internal power line IL and electrically connected to the input/output terminal unit 110. Accordingly, as an operating state of the switching unit 120 is controlled to be turned on or turned off, thereby energizing or blocking the internal power line IL.

That is, as an operating state of the switching unit 120 is controlled to be a turned-on state, a driving voltage of the driving voltage supply Vo may be applied to the input/output terminal unit 110. Accordingly, the input/output terminal unit 110 outputs a driving voltage to the external apparatus 1, thereby driving the external apparatus 1.

The switching unit 120 may be a field-effect transistor (FET) device, and the external apparatus 1 may be an actuator.

That is, the apparatus for preventing short circuit 100 according to the present disclosure may be provided inside a vehicle and connected to an actuator.

The variable resistor unit 130 may be mounted on the internal power line IL and electrically connected to the other end of the switching unit 120. That is, the variable resistor unit 130 may be electrically connected between the driving voltage supply Vo and the switching unit 120, and may be serially connected to the switching unit 120.

A set resistance value of the variable resistor unit 130 may be modified according to control by the control unit 160 which will be described later. To this end, the variable resistor unit 130 may be a digital potentiometer, a resistance value of which is changed in accordance with an input value input from the control unit 160.

In the above-described description, the variable resistor unit 130 is described to be a digital potentiometer, it should be noted that the type of the variable resistor unit 130 is not limited as long as a set resistance value is modifiable by the control of the control unit 160.

The sensing unit 140 is operably coupled to the control unit 160 which will be described later. That is, the sensing unit 140 may be coupled to the control unit 160 such that the sensing unit 140 transmits an electrical signal to the control unit 160 or receives an electrical signal from the control unit 160.

The sensing unit 140 may measure, for each preset cycle, one end voltage applied to one end of the switching unit 120 and the other end voltage applied to the other end of the switching unit 120.

In addition, the sensing unit 140 may measure a current flowing through the internal power line IL on each preset cycle.

The sensing unit 140 as above may provide measurement signals respectively indicating the measured one end voltage, the measured other end voltage, and the measured current to the control unit 160.

The sensing unit 140 may include a voltage sensor configured to measure a voltage. In addition, the sensing unit 140 may further include a current sensor configured to measure a current.

When a measurement signal is received from the sensing unit 140, the control unit 160 may determine a first measurement voltage value, a second measurement voltage value, and a measurement current value respectively as the measured one end voltage, the measured other end voltage, and the measured current, through signal processing, and store the voltage values in the memory unit 150.

The memory unit 150 may be a semiconductor memory device, and may write, erase or update data generated using the control unit 160, determine whether the input/output terminal unit 110 is shorted, and store a plurality of program codes provided to control a set resistance value of the variable resistor unit 130. In addition, the memory unit 150 may store preset setting values of various preset parameters used in implementing the present disclosure.

The memory unit 150 may be a semiconductor memory device of any type as long as the memory unit 150 is a semiconductor memory device known to write, erase or update data. For example, the memory unit 150 may be a DRAM, an SDRAM, a flash memory, a ROM, an EEPROM, a register, or the like. The memory unit 150 may further include a storage medium storing program codes in which control logic of the control unit 160 is defined. The storage medium includes a non-volatile memory device such as a flash memory or a hard disk. The memory unit 150 may be physically separated from the control unit 160 or may be integrated to the control unit 160.

The control unit 160 may determine whether the input/output terminal unit 110 is shorted, based on a measurement current value of a current flowing through the internal power line IL, and may control a set resistance value of the variable resistor unit 130 in accordance with a result of the determining a short circuit.

In detail, when a measurement current value of a current flowing through the internal power line IL exceeds a preset reference current value, the control unit 160 may determine that the input/output terminal unit 110 is shorted.

Here, according to an embodiment, when a ground GND and the external apparatus 1 located outside are electrically connected via the first external power line OL1, and the driving voltage supply Vo provided inside and the input/output terminal unit 110 are electrically connected via the internal power line IL, and a measurement current value exceeds a preset reference current value, as illustrated in FIG. 4, the control unit 160 may determine that the input/output terminal unit 110 is shorted from another ground GND' different from the ground GND connected to the external apparatus 1.

Here, a preset reference current value may be a current value, which is a reference for determining whether the input/output terminal unit 110 is shorted, and when the input/output terminal unit 110 is shorted, the preset reference current value may be a minimum current value of a current that may flow through the internal power line IL. For example, the preset reference current value may be "1A".

Here, another ground GNU may be chassis or a frame of a vehicle.

Referring to FIG. 4, when the input/output terminal unit 110 is shorted from another ground GND' different from the ground GND connected to the external apparatus 1, the internal power line IL may be changed to a nonloaded circuit state, and thus a high current may flow therethrough. Accordingly, an output of the driving voltage supply Vo may exceed an output limit, and shutdown of the apparatus for preventing short circuit 100 and the entire electrical system of the vehicle including the apparatus for preventing short circuit 100 may occur.

Here, a short circuit of the input/output terminal unit 110 may lead to an external impact due to a collision of a vehicle, incorrect connection of circuits or the like. Accordingly, when it is determined that the input/output terminal unit 110 is shorted, the control unit 160 may control a set resistance value of the variable resistor unit 130 to be a preset reference resistance value.

In detail, when it is determined that the input/output terminal unit 110 is shorted, the control unit 160 may control a set resistance value of the variable resistor unit 130 to be a preset reference resistance value such that the internal power line IL is not changed to a nonloaded circuit state and no high current flows.

Here, the preset reference resistance value may be limited such that a voltage applied to the external apparatus 1 is included in a voltage range in which the external apparatus 1 is drivable. For example, the preset reference voltage value may be "1Ω".

According to the configuration of the present disclosure, even when a short circuit occurs in the input/output terminal unit 110, the control unit 160 controls a set resistance value of the variable resistor unit 130 mounted on the internal power line IL to be a preset reference voltage value, thereby preventing a high current flowing through the internal power line IL and thus preventing output of the driving voltage supply Vo from exceeding the output limit.

On the other hand, when it is determined that the input/output terminal unit 110 is not shorted, the control unit 160 may control a set resistance value of the variable resistor unit 130 to be at "0Ω".

According to the configuration of the present disclosure, when no short circuit occurs in the input/output terminal unit 110, the control unit 160 may control a set resistance value of the variable resistor unit 130 to be at "0Ω", thereby preventing unnecessary voltage drop occurring in the variable resistor unit 130.

Meanwhile, before determining whether the input/output terminal unit 110 is shorted, the control unit 160 may determine an operating state of the switching unit 120, and may determine or not determine whether the input/output terminal unit 110 is shorted, based on a result of determining the operating state of the switching unit 120.

In detail, the control unit 160 may determine whether an operating state of the switching unit 120 is any one operating state of a turned-on state and a turned-off state based on a measurement voltage difference between a first measurement voltage value of one end voltage applied to one end of the switching unit 120 and a second measurement voltage value of the other end voltage applied to the other end of the switching, unit 120.

When the measurement voltage difference is equal to or less than a preset reference voltage difference, the control unit 160 may determine that the operating state of the switching unit 120 is a turned-on state, and when the measurement voltage difference exceeds the preset reference voltage difference, the control unit 160 may determine that the operating state of the switching unit 120 is a turned-off state.

The preset reference voltage difference may be a voltage value used as a reference for determining an operating state of the switching unit 120. The preset reference voltage difference may be half of a driving voltage of the driving voltage supply Vo. For example, the preset reference voltage difference may be "6V".

Next, when an operating state of the switching unit 120 is a turned-on state after determining the operating state of the switching unit 120, the control unit 160 may determine whether the input/output terminal unit 110 is shorted, and control a set resistance value of the variable resistor unit 130 based on a result of the determining.

On the other hand, as a result of determining an operating state of the switching unit 120, when the operating state of the switching unit 120 is a turned-off state, the control unit 160 may omit determining whether the input/output terminal unit 110 is shorted.

According to the configuration of the present disclosure as described above, even when a short circuit occurs in the input/output terminal unit 110, since the switching unit 120 is in a turned-off state, if no high current flows through the internal power line IL, the control unit 160 may not determine whether the input/output terminal unit 110 is shorted.

The control unit 160 may selectively include an application-specific integrated circuit (ASIC), another chip set, a logic circuit, a register, a communication modem, a data processing apparatus, or the like known in the art to execute various control logics. At least one of the various control logics executable by the control unit 160 may be combined, and the combined control logics may be written as a computer readable code system and listed in a computer readable recording medium. A recording medium type is not specifically limited as long as the recording medium is accessible by the control unit 160 included in a computer. For example, a recording medium includes at least one selected from the group consisting of ROM, RAM, a register, CD-ROM, a magnetic tape, a hard disk, a floppy disk, and an optical data recording apparatus. In addition, a code system may be modulated with a carrier signal and included in a communication carrier at a certain point in time, and distributed and stored in a network-connected computer and executed. In addition, functional programs, codes, and code segments for implementing the combined control logics may be easily inferred by programmers skilled in the art to which the present disclosure pertains.

Hereinafter, an apparatus for preventing short circuit 100' according to another embodiment of the present disclosure will be described in detail.

The apparatus for preventing short circuit 100' according to another embodiment of the present disclosure may be different from the apparatus for preventing short circuit 100 according to an embodiment only in terms of electrical connection of some components. Thus, repeated description will be omitted.

Figure 5:
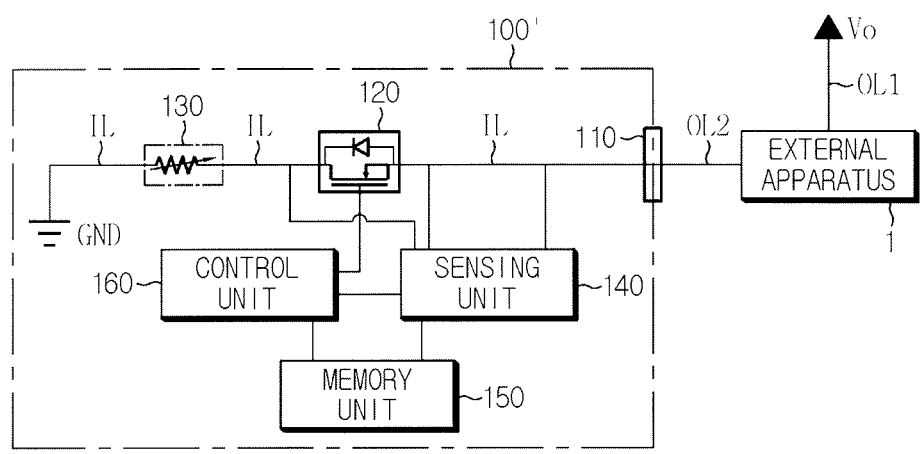
FIG. 5 illustrates a configuration of an apparatus for preventing short circuit according to another embodiment of the present disclosure, before a short circuit.
Figure 6:
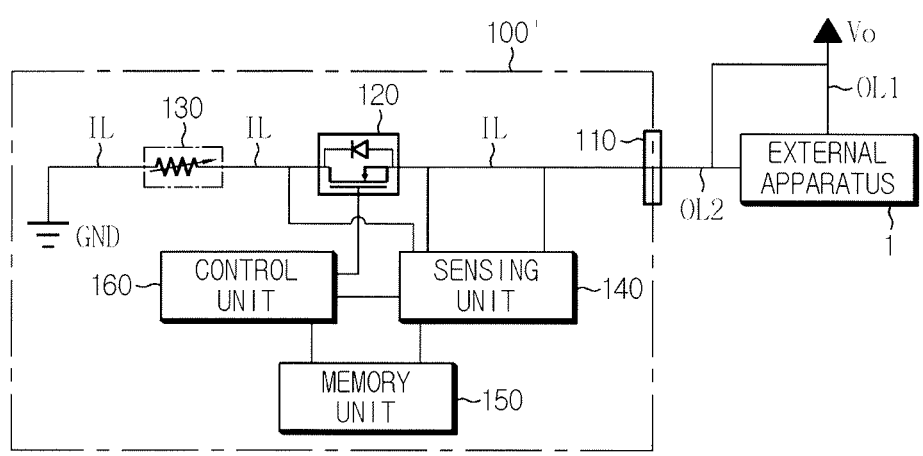
FIG. 6 illustrates a configuration of an apparatus for preventing short circuit according to another embodiment of the present disclosure, after a short circuit.

FIG. 5 illustrates a configuration of the apparatus for preventing short circuit 100' according to another embodiment of the present disclosure, before a short circuit, and FIG. 6 illustrates a configuration of the apparatus for preventing short circuit 100' according to another embodiment of the present disclosure, after a short circuit.

First, referring to FIG. 5, the apparatus for preventing short circuit 100' according to another embodiment of the present disclosure may include an input/output terminal unit 110, an internal power line IL, a switching unit 120, a variable resistor unit 130, a sensing unit 140, a memory unit 150, and a control unit 160. In addition, the apparatus for preventing short circuit 100' according to another embodiment of the present disclosure may further include a ground GND therein.

As described above, the input/output terminal unit 110 may be electrically connected, via a second external power line OL2, to an external apparatus 1 that is electrically connected to a driving voltage supply Vo outside via a first external power line OL1.

Meanwhile, the internal power line IL may electrically connect the ground GND provided inside to the input/output terminal unit 110.

Accordingly, a driving voltage of the driving voltage supply Vo dropped due to a resistance component of the external apparatus 1 may be applied to the input/output terminal unit 110 via the internal power line IL.

The switching unit 120 may be mounted on the internal power line IL and electrically connected to the input/output terminal unit 110. Accordingly, as an operating state of the switching unit 120 is controlled to be in a turned-on or turned-off state, the internal power line IL may be energized or blocked.

That is, as an operating state of the switching unit 120 is controlled to be turned on, a driving voltage of the driving voltage supply Vo is applied to the external apparatus 1, thus driving the external apparatus 1.

The variable resistor unit 130 may be mounted on the internal power line IL and electrically connected to the other end of the switching unit 120. That is, the variable resistor unit 130 may be electrically connected between the driving voltage supply Vo and the switching unit 120, and may be serially connected to the switching unit 120.

A set resistance value of the variable resistor unit 130 may be modified according to the control by the control unit 160 which will be described later.

The sensing unit 140 is operably coupled to the control unit 160 which will be described later. That is, the sensing unit 140 may be coupled to the control unit 160 such that the sensing unit 140 may transmit an electrical signal to the control unit 160 or receive an electrical signal from the control unit 160.

The sensing unit 140 may measure, in each preset cycle, one end voltage applied to one end of the switching unit 120 and the other end voltage applied to the other end of the switching unit 120.

In addition, the sensing unit 140 may measure a current flowing through the internal power line IL in each preset cycle.

The sensing unit 140 as above may provide measurement signals respectively indicating the measured one end voltage, the measured other end voltage, and the measured current, to the control unit 160.

When a measurement signal is received from the sensing unit 140, the control unit 160 may determine a first measurement voltage value, a second measurement voltage value, and a measurement current value respectively as the measured one end voltage, the measured other end voltage, and the measured current, through signal processing, and store the same in the memory unit 150.

The memory unit 150 may be a semiconductor memory device, and may write, erase or update data generated using the control unit 160, determine whether the input/output terminal unit 110 is shorted, and store a plurality of program codes provided to control a set resistance value of the variable resistor unit 130. In addition, the memory unit 150 may store preset setting values of various preset parameters used in implementing the present disclosure.

The control unit 160 may determine whether the input/output terminal unit 110 is shorted, based on a measurement current value of a current flowing through the internal power line IL, and may control a set resistance value of the variable resistor unit 130 in accordance with a result of the determining a short circuit.

In detail, when a measurement current value of a current flowing through the internal power line IL exceeds a preset reference current value, the control unit 160 may determine that the input/output terminal unit 110 is shorted.

Here, according to another embodiment, when the driving voltage supply Vo located outside and the external apparatus 1 are electrically connected via the first external power line OL1, and the ground GND provided inside and the input/output terminal unit 110 are electrically connected via the internal power line IL, and a measurement current value exceeds a preset reference current value, as illustrated in FIG. 6, the control unit 160 may determine that the input/output terminal unit 110 is shorted from the driving voltage supply Vo located outside.

Referring to FIG. 6, when the input/output terminal unit 110 is shorted from the driving voltage supply Vo located outside, the internal power line IL may be changed to a nonloaded circuit state, and thus a high current may flow. Accordingly, an output of the driving voltage supply Vo may exceed an output limit, and shutdown of the apparatus for preventing short circuit 100' and the entire electrical system of a vehicle including, the apparatus for preventing short circuit 100' may occur.

Here, a short circuit of the input/output terminal unit 110 may lead due to an external impact caused by collision of the vehicle or incorrect connection of circuits, or the like.

Accordingly, the input/output terminal unit 110 is determined to be shorted, the control unit 160 may control a set resistance value of the variable resistor unit 130 to be a preset reference resistance value.

In detail, when the input/output terminal unit 110 is determined to be shorted, the control unit 160 may control a set resistance value of the variable resistor unit 130 to be a preset reference resistance value such that the internal power line IL is not changed to a nonloaded circuit state and no high current flows.

According to the configuration of the present disclosure, even when a short circuit occurs in the input/output terminal unit 110, the control unit 160 controls a set resistance value of the variable resistor unit 130 mounted on the internal power line IL to be a preset reference voltage value, thereby preventing a high current flowing through the input/output terminal unit 110 and an output of the driving voltage supply Vo from exceeding an output limit.

On the other hand, when it is determined that the input/output terminal unit 110 is not shorted, the control unit 160 may control a set resistance value of the variable resistor unit 130 to be "0Ω".

According to the configuration of the present disclosure, when no short circuit occurs in the input/output terminal unit 110, the control unit 160 may control a set resistance value of the variable resistor unit 130 to be "0Ω", thereby preventing unnecessary voltage drop occurring in the variable resistor unit 130.

Meanwhile, a battery pack according to the present disclosure may include the above-described apparatus for preventing short circuit. Meanwhile, a vehicle according to the present disclosure may include the above-described apparatus for preventing short circuit.

Embodiments of the present disclosure described above are not embodied only through an apparatus and a method, but may be embodied through a program realizing a function corresponding to a feature of the embodiments of the present disclosure or a recording medium having recorded thereon the program, and such embodiments may be easily embodied by experts of technical fields to which the present disclosure belongs, from the description of the embodiments described above.

The present disclosure has been described by limited embodiments and drawings, but the present disclosure is not limited thereto, and various changes and modifications are possible within the scope of the disclosure and the equivalent range of appended claims by one of ordinary skill in the art.

Also, since the present disclosure described above may be variously substituted, modified, and changed by one of ordinary skill in the art within the range of the technical ideas of the present disclosure, the present disclosure is not limited by the above-described embodiments and appended drawings, but all or some of the embodiments may be selectively combined for various modifications.

What is claimed is:

1. An apparatus for preventing short circuit comprising:
   an input/output terminal configured to be electrically connected, via a second external power line, to an external apparatus that is electrically connected to one of a driving voltage supply or a first ground via a first external power line;
   an internal power line electrically configured to connect one of the driving voltage supply or the first ground to the input/output terminal;
   a switch configured to be mounted on the internal power line, the switch having a first end electrically connected to the input/output terminal and configured to energize or block the internal power line;
   a variable resistor configured to be mounted on the internal power line and configured to be electrically connected to a second end of the switch; and
   a controller configured to:
      determine whether the input/output terminal is shorted based on a measurement current value of a current flowing through the internal power line, and
      control a set resistance value of the variable resistor based on whether the input/output terminal is shorted.

2. The apparatus for preventing short circuit according to claim 1, wherein when the measurement current value exceeds a preset reference current value, the controller determines that the input/output terminal is shorted.

3. The apparatus for preventing short circuit according to claim 1, wherein when the first ground and the external apparatus are electrically connected via the first external power line, the driving voltage supply and the input/output terminal are electrically connected via the internal power line, and
   wherein when the measurement current value exceeds a preset reference current value, the controller determines that the input/output terminal is shorted from a second ground different from the first ground connected to the external apparatus.

4. The apparatus for preventing short circuit according to claim 1, wherein when the controller determines that the input/output terminal is shorted, the controller controls the set resistance value of the variable resistor to be a preset reference resistance value.

5. The apparatus for preventing short circuit according to claim 1, wherein the controller determines whether an operating state of the switch is any one operating state of a turned-on state or a turned-off state based on a measurement voltage difference between a first measurement voltage value of a first end voltage applied to a first end of the switch and a second measurement voltage value of a second end voltage applied to second end of the switch.

6. The apparatus for preventing short circuit according to claim 5, wherein when the controller determines that the switch is in the turned-on state, the controller determines whether the input/output terminal is shorted, and controls the set resistance value of the variable resistor based on whether the input/output terminal is shorted.

7. The apparatus for preventing short circuit according to claim 5, wherein when the controller determines that the switch is in the turned-off, the controller does not determine whether the input/output terminal is shorted.

8. A battery pack comprising the apparatus for preventing short circuit according to claim 1.

9. A vehicle comprising the apparatus for preventing short circuit according to claim 1.

* * * * *